United States Patent
Zhang et al.

(10) Patent No.: US 11,538,835 B2
(45) Date of Patent: Dec. 27, 2022

(54) ARRAY SUBSTRATE WITH DUMMY LEAD INCLUDING DISCONNECTED CONDUCTING WIRES, METHOD FOR MANUFACTURING THE SAME, DISPLAY PANEL AND DISPLAY DEVICE

(71) Applicants: Beijing BOE Optoelectronics Technology Co., Ltd., Beijing (CN); BOE Technology Group Co., Ltd., Beijing (CN)

(72) Inventors: Dawei Zhang, Beijing (CN); Jianxing Shang, Beijing (CN); Shuai Yan, Beijing (CN); Song Ruan, Beijing (CN); Sen Li, Beijing (CN)

(73) Assignees: Beijing BOE Optoelectronics Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 597 days.

(21) Appl. No.: 16/489,878

(22) PCT Filed: Jan. 2, 2019

(86) PCT No.: PCT/CN2019/070061
§ 371 (c)(1),
(2) Date: Aug. 29, 2019

(87) PCT Pub. No.: WO2019/210702
PCT Pub. Date: Nov. 7, 2019

(65) Prior Publication Data
US 2022/0052081 A1    Feb. 17, 2022

(30) Foreign Application Priority Data

May 2, 2018    (CN) .......................... 201810410453.X

(51) Int. Cl.
*H01L 27/12* (2006.01)
*G06F 3/041* (2006.01)

(52) U.S. Cl.
CPC ........ *H01L 27/1244* (2013.01); *G06F 3/0412* (2013.01); *H01L 27/1259* (2013.01); *G06F 2203/04103* (2013.01)

(58) Field of Classification Search
CPC ............. H01L 27/1244; H01L 27/1259; G06F 3/0412; G06F 3/0443; G06F 3/04164; G06F 3/041; G06F 2203/04103
See application file for complete search history.

(56) References Cited

U.S. PATENT DOCUMENTS

2012/0097951 A1* 4/2012 Kang .................. H01L 27/3223
  438/34
2016/0062164 A1* 3/2016 Chae .................... G02F 1/13338
  349/12

(Continued)

FOREIGN PATENT DOCUMENTS

CN    105808014 A    7/2016
CN    106935598 A    7/2017

(Continued)

OTHER PUBLICATIONS

Chinese Office Action for corresponding application 201810410453.X dated Apr. 16, 2019.

(Continued)

*Primary Examiner* — Nilufa Rahim
(74) *Attorney, Agent, or Firm* — Michael Fainberg

(57) ABSTRACT

The disclosure discloses an array substrate, a method for manufacturing the same, a display panel and a display device. The array substrate includes a base substrate; a plurality of data lines and a plurality of dummy leads, wherein the plurality of data lines and the plurality of dummy leads are in the same layer on the base substrate, and (Continued)

the plurality of data lines and the plurality of dummy leads extend along the first direction; and at least one dummy lead includes a plurality of wires which extend in the first direction and are disconnected with one another.

7 Claims, 3 Drawing Sheets

(56) References Cited

U.S. PATENT DOCUMENTS

2018/0203541 A1\* 7/2018 Liu ..................... G06F 3/04164
2019/0034014 A1   1/2019 Wu et al.
2022/0075222 A1\* 3/2022 Obinata ............ G02F 1/136286

FOREIGN PATENT DOCUMENTS

| CN | 107608560 A | 1/2018 |
| CN | 108595053 A | 9/2018 |
| JP | 5106471 B2 | 12/2012 |

OTHER PUBLICATIONS

Chinese Office Action for corresponding application 201810410453.X dated Aug. 22, 2019.

\* cited by examiner

ARRAY SUBSTRATE WITH DUMMY LEAD INCLUDING DISCONNECTED CONDUCTING WIRES, METHOD FOR MANUFACTURING THE SAME, DISPLAY PANEL AND DISPLAY DEVICE

This disclosure is a US National Stage of International Application No. PCT/CN2019/070061, filed Jan. 2, 2019, which claims priority to Chinese Patent Application No. 201810410453.X, filed with the Chinese Patent Office on May 2, 2018, and entitled "Array Substrate, Method for Manufacturing the Same, Display Panel and Display Device", the content of which is hereby incorporated by reference in its entirety.

FIELD

The disclosure relates to the field of display technology, and in particular to an array substrate, a method for manufacturing the same, a display panel and a display device.

BACKGROUND

With the rapid development of display technology, touch display products have gradually spread throughout our lives. At present, the leads related to touching include the leads arranged in the same layer as the data lines, which are easily shorted to the data lines. In summary, in the prior art, because the leads arranged in the same layer as the data lines are easily shorted to the data lines, the voltage on the data line is lowered, dark lines appear, the display quality and the user experience are affected.

SUMMARY

An embodiment of the disclosure provides an array substrate. The array substrate includes: a base substrate; and a plurality of data lines and a plurality of dummy leads, wherein the plurality of data lines and the plurality of dummy leads are in a same layer on the base substrate, and the plurality of data lines and the plurality of dummy leads extend in the first direction; and at least one of the dummy leads includes a plurality of conducting wires which extend in the first direction and are disconnected with one another.

Optionally, in the embodiment of the disclosure, the array substrate further includes a plurality of touch electrodes on the base substrate and in a different layer with the data lines; wherein the plurality of the touch electrodes are in an array, and the plurality of touch electrodes include a plurality of touch electrode columns, the direction of the touch electrode columns is the first direction, and the number of the conducting wires in each dummy lead is equal to the number of the touch electrodes in a touch electrode column.

Optionally, in the embodiment of the disclosure, an orthographic projection of each of the touch electrode columns on the base substrate has an overlapping area with an orthographic projection of at least one of the dummy leads on the base substrate.

Optionally, in the embodiment of the disclosure, an orthographic projection of an interval area between two adjacent conducting wires in each of the dummy leads on the base substrate is within an orthographic projection of an interval area between two adjacent touch electrodes in each of the touch electrode columns on the base substrate.

Optionally, in the embodiment of the disclosure, different conducting wires in each of the dummy leads are on a same straight line extending in the first direction.

Optionally, in the embodiment of the disclosure, lengths of different conducting wires are equal.

Optionally, in the embodiment of the disclosure, the array substrate further includes a plurality of touch leads extending in the first direction and arranged in the second direction and a plurality of pixels in an array on the base substrate; wherein each of the touch electrodes is connected with at least one of the touch leads; the plurality of pixels include a plurality of pixel columns, the direction of the pixel columns is the first direction; and the sum of the number of the dummy leads and the number of the touch leads is equal to the number of the pixel columns.

Optionally, in the embodiment of the disclosure, at least one of the touch leads includes a first sub-touch lead and a second sub-touch lead in different layers and connected through a via hole; the second sub-touch lead and the data lines are in a same layer.

Optionally, in the embodiment of the disclosure, the array substrate further includes touch dummy leads on the base substrate and in a same layer as the first sub-touch lead; wherein an orthographic projection of at least one of the touch dummy leads on the base substrate has an overlapping area with an orthographic projection of at least one of the dummy leads on the base substrate; and at least one of the touch dummy leads includes a plurality of sub-leads which extend in the first direction and are disconnected with one another.

Accordingly, the embodiment of the t disclosure provides a display panel including the array substrate.

Accordingly, the embodiment of the disclosure provides a display device including the display panel.

Accordingly, the embodiment of the disclosure provides a method for manufacturing the array substrate. The method includes: forming a pattern of the dummy leads and a pattern of the data lines in a same layer on the base substrate; wherein forming of the pattern of the dummy leads includes: forming a pattern of a plurality of conducting wires which extend in the first direction and are disconnected with one another via a mask including a plurality of openings which extend in the first direction and are disconnected with one another.

DETAILED DESCRIPTION

Figure 1:
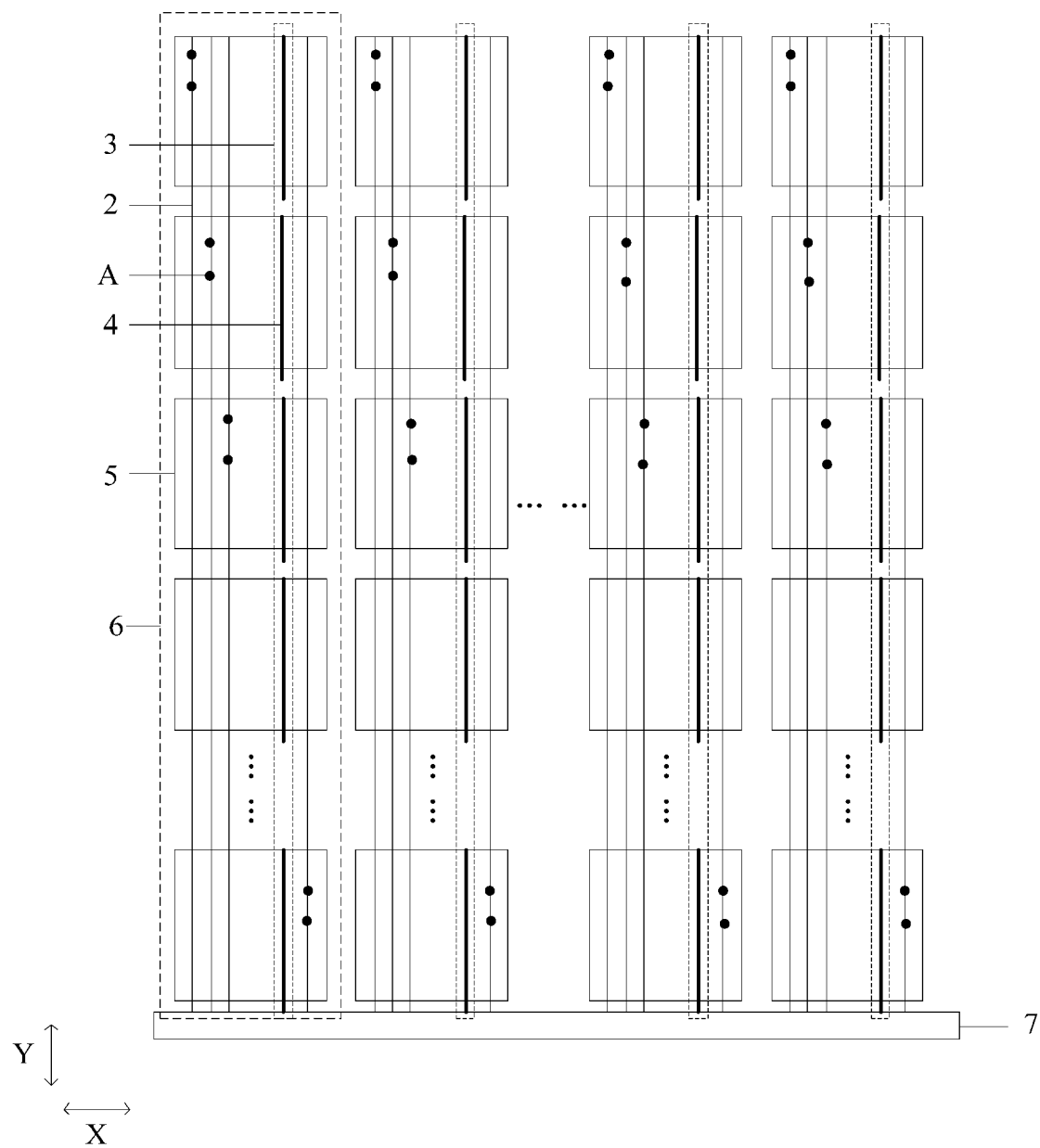
FIG. 1 is a schematic structural diagram of an array substrate in accordance with an embodiment of the disclosure.

In order to more clearly describe the object, technical solution and advantages of the disclosure, the disclosure will be described in detail in conjunction with the accompanying drawings. Obviously, the embodiments herein are only part of the embodiments of the disclosure. All other embodiments obtained by those ordinary skilled in the art based on the embodiments of the disclosure without any creative efforts fall into the protection scope of the disclosure.

The shapes and sizes of the components in the drawings do not reflect the true proportions, and the purpose is merely to illustrate the contents of the disclosure.

An embodiment of the disclosure provides an array substrate, as shown in FIG. 1, which includes: a base substrate (not shown in FIG. 1); and a plurality of data lines (not shown in FIG. 1) and a plurality of dummy leads 3, the plurality of data lines and the plurality of dummy leads 3 are located in the same layer on the base substrate, and the plurality of data lines and the plurality of dummy leads 3 extend in the first direction Y; and at least one of the dummy leads 3 includes a plurality of conducting wires 4, the plurality conducting wires 4 extend in the first direction Y and are disconnected with one another.

In the array substrate in accordance with the embodiment of the disclosure, due to the case that the data line and the dummy lead are relatively close, such as the case that both the data line and the dummy lead are located at the same pixel gap, the data line and the dummy lead are easy to be short-circuited. Compared with arranging one whole dummy lead, since the dummy lead includes a plurality of conducting wires which extend along the first direction and are disconnected with one another, when the dummy lead and the data line in the same layer are short-circuited, the length of the conducting wire short-circuited with the data line is reduced, and the voltage reduction degree of the data line is reduced, so that the dark lines are avoided, the display effect and the user experience are improved.

In a specific implementation, the plurality of data lines and the plurality dummy leads extend along the first direction Y. The arrangement of the plurality of data lines and the plurality of dummy leads in the second direction X can be determined according to actual needs, wherein the second direction X and the first direction Y can be cross-arranged, for example, vertically crossed or crossed with another angle, and is not limited herein.

Optionally, in the array substrate in accordance with the embodiment of the disclosure, as shown in FIG. 1, different conducting wires 4 in each dummy lead 3 are on the same straight line extending along the first direction Y, so that the dummy leads uniformly arranged in the area where the array substrate is located, and the uniformity of product display can be further guaranteed.

Optionally, as shown in FIG. 1, the lengths of different conducting wires 4 are equal. Thus, the same voltage reduction degree can be guaranteed for the data lines. In the embodiments of the disclosure, all conducting wires 4 on the array substrate can be arranged to the same length. In addition, the lengths of conducting wires 4 can be arranged regionally, for example, each conducting wire 4 belonging to the same dummy lead 3 has the same length, or the conducting wires 4 in the middle of the display area have the same length, the conducting wires 4 at the edge of the display area have the same length. The lengths of the conducting wires can be arranged according to actual needs, and is not limited herein.

Optionally, the array substrate in accordance with the embodiment of the disclosure, as shown in FIG. 1, may further include a plurality of touch electrodes 5 located on the base substrate and in a different layer with the data lines.

The plurality of touch electrodes 5 are arranged in an array, and the plurality of touch electrodes 5 include a plurality of touch electrode columns 6, the column direction of the touch electrode columns is the first direction Y, and the number of conducting wires 4 in each dummy lead 3 is equal to the number of touch electrodes 5 in a touch electrode column 6. In this way, it is easy to design the structure of the array substrate and to realize the process of forming a plurality of conducting wire segments.

In the array substrate in accordance with the embodiment of the disclosure, as shown in FIG. 1, the number of conducting wires 4 in each dummy lead 3 is equal to the number of touch electrodes 5 in a touch electrode column 6, so as to facilitate the structure design of the array substrate and easily realize the process of forming a plurality of conducting wire segments. On this basis, the lengths of different conducting wires 4 in each dummy lead 3 are equal. Thus, the length of each conducting wire can be guaranteed to be the shortest, and the voltage reduction degree of the data line can be reduced to the greatest extent.

Optionally, in the plane where the array substrate is located, the orthographic projection of each touch electrode column on the base substrate has an overlapping area with the orthographic projection of at least one dummy lead on the base substrate, so that each touch electrode column corresponds to at least one dummy lead, to enable the dummy leads to be distributed substantially uniformly on the base substrate.

Optionally, in the array substrate in accordance with the embodiment of the disclosure, as shown in FIG. 1, the orthographic projection of the interval area between the two adjacent conducting wires 4 in each dummy lead 3 on the base substrate falls into the orthographic projection of the interval area between the two adjacent touch electrodes 5 in each touch electrode column 6 on the base substrate. That is, each touch electrode corresponds to at least one conducting wire, so that the position of the conducting wire corresponds to the position of the touch electrode, making the arrangement of the conducting wires more uniform, and further improving the display uniformity.

Optionally, the array substrate in accordance with the embodiment of the disclosure may further include a plurality of touch leads which extend in the first direction and are arranged in the second direction, and a plurality of pixels arranged in an array on the base substrate; each touch electrode is connected with at least one touch lead; the plurality of pixel units include a plurality of pixel unit columns, the column direction of the plurality of pixel unit columns is the first direction; the sum of the number of dummy leads and the number of touch leads is equal to the number of pixel unit columns.

Figure 2:
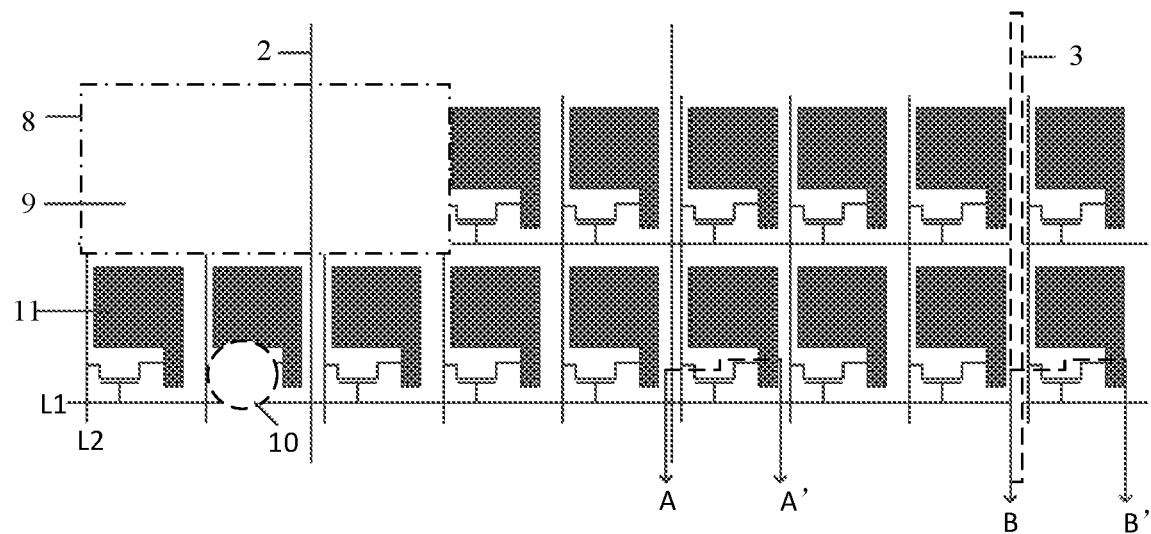
FIG. 2 is a schematic diagram of a positional relation between a pixel unit and a lead in accordance with an embodiment of the disclosure.

As shown in FIG. 1, the array substrate includes touch leads 2 connected with touch electrodes 5, and a drive circuit 7 connected with the touch leads 2 and the dummy leads 3. The drive circuit 7 provides common voltage signal and touch signal to the touch leads 2. In addition, the drive circuit 7 can also provide a common voltage signal to the dummy leads 3 to enhance the display uniformity. The touch lead 2 is electrically connected with the touch electrode 5 at connection area A. Specifically, the touch lead 2 is electrically connected with the touch electrode 5 through a via hole at the position of the connection area A. FIG. 1 illustrates that each touch lead and the touch electrode are electrically connected through two connecting areas A. In a specific implementation, the touch lead and the touch electrode can be electrically connected through only one connecting area or more connecting areas, the disclosure will not be limited thereto. FIG. 2 is a schematic diagram of the relation between part of the pixels and the leads. In FIG. 2, each pixel 8 includes three sub-pixels 9. For example, each pixel 5 may include a red sub-pixel, a blue sub-pixel and a green sub-pixel, or more sub-pixels, and is not limited herein. Each sub-pixel is defined by intersected gate line L1 and data line L2. Each sub-pixel unit 9 includes a Thin Film Transistor (TFT) 10 connected with the gate line L1 and data line L2 and a pixel electrode 11 connected with the TFT. Each pixel column of the pixels 8 corresponds to a dummy lead 3 or a touch lead 2, which can ensure that the number of leads (touch leads or dummy leads) is equal to the number of pixel columns, thus ensuring the display uniformity of the product. In addition, when the different conducting wires in each dummy lead do not align in the first direction, the leads can be uniformly arranged in the area where the array substrate is located, and the display uniformity of the product can be further guaranteed.

In a specific implementation, each touch electrode column corresponds to N pixel columns, and each touch electrode column includes M touch electrodes. As shown in FIG. 1, each touch electrode column 6 needs to correspond to M touch leads 2. When M<N and each touch electrode is connected with one touch lead, in order to ensure the uniformity of display, that is to say, in order to ensure that the number of pixel columns is the same as the number of leads, N−M dummy leads are needed in the coverage area of each touch electrode column. FIG. 1 merely illustrates that the orthographic projection of each touch electrode column covers the orthographic projection of one dummy lead. In the actual design of the array substrate structure, in order to ensure the uniformity of display, it is necessary to determine how many dummy leads each touch electrode column corresponds to according to the M, N and the number of leads connected with each touch electrode. In addition, the touch electrodes in FIG. 1 are rectangular, and the touch electrodes can be of other shapes. The shape of the touch electrodes and the lead arrangements of the array substrate can be selected according to actual needs.

Optionally, in the array substrate in the embodiments of the disclosure, the touch lead includes a first sub-touch lead and a second sub-touch lead located in different layers and connected through via hole; the second sub-touch lead is arranged in the same layer as the data line.

That is, the dummy lead and the second sub-touch lead are arranged in the same layer, and the orthographic projection of the first sub-touch electrode on the base substrate has an overlapping area with the orthographic projection of the second sub-touch electrode on the base substrate. Therefore, the first sub-touch electrode and the second sub-touch electrode located on different layers can be connected through via hole, so that the resistance of the touch lead can be reduced. Arranging the second sub-touch lead and the data line in the same layer can simplify the manufacturing process of the array substrate.

Figure 3:
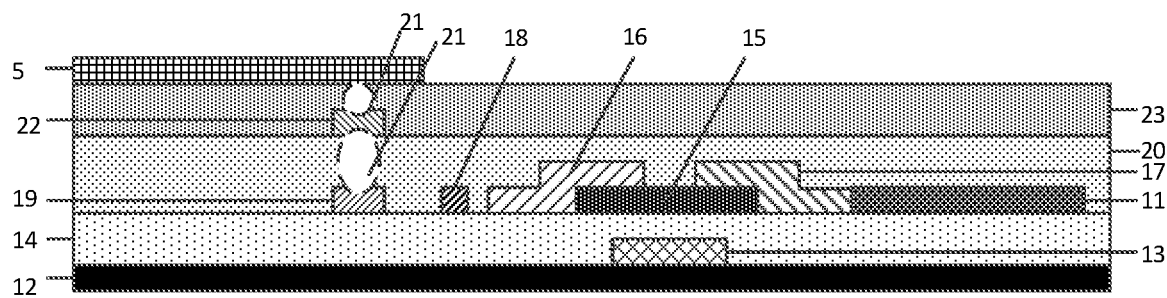
FIG. 3 is a sectional view along AA' in FIG. 2 in accordance with an embodiment of the disclosure.
Figure 4:
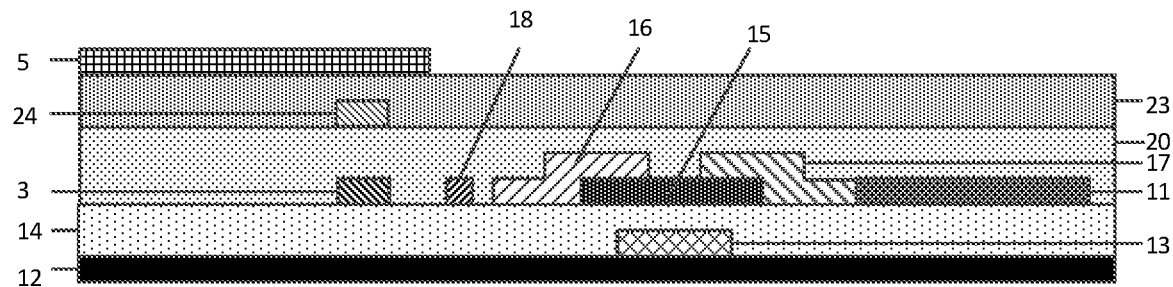
FIG. 4 is a sectional view along BB' in FIG. 2 in accordance with an embodiment of the disclosure.

Next, by taking the sectional views along AA' and BB' in FIG. 2 as an example, the structure of the array substrate in accordance with the embodiments of the disclosure is illustrated. FIG. 3 is a sectional view along AA' in FIG. 2, and FIG. 4 is a sectional view along BB' in FIG. 2. As shown in FIG. 3, the upper array substrate includes: a base substrate 12, a gate electrode 13, a gate insulating layer 14, an active layer 15, a source electrode 16, a drain electrode 17, a pixel electrode 11 connected with the drain electrode 17, a data line 18 and a second sub-touch lead 19 arranged in the same layer as the source electrode 16 and drain electrode 17, a first insulating layer 20, a first sub-touch lead 22 connected with the second sub-touch lead 19 through a via hole 21 arranged in the first insulating layer 20, a second insulating layer 23, and a touch electrode 5 connected with the first sub-touch lead 22 through the via hole 21 arranged in the second insulating layer 23, wherein the second sub-touch lead 19 can be called SDT (Source Data Metal) line, the first sub-touch lead 22 can be called TPM (Touch Panel Metal) line, and the dummy lead arranged in the same layer as the SDT line in the embodiments of the disclosure can be called dummy SDT line.

In addition, the array substrate in accordance with the embodiments of the disclosure, as shown in FIGS. 3 and 4, may further include touch dummy leads 24 located on the base substrate 12 and in the same layer as the first sub-touch leads 22; the orthographic projection of the touch dummy lead 24 on base substrate 12 has an overlapping area with the orthographic projection of the dummy lead 3 on base substrate 12; the touch dummy lead includes a plurality sub-leads which extend in the first direction Y and are disconnected with one another (not shown in the figure).

The touch dummy lead can be represented as a dummy TPM line, and the touch dummy lead can also be arranged as a plurality of sub-leads which extend along the first direction and are disconnected with one another, so that the arrangement of the touch dummy lead is consistent with that of the dummy lead, which is conducive to the uniformity of arrangement, thus facilitating the display uniformity. The arrangement of the sub-leads in the touch dummy lead can refer to that of each conducting wire in the dummy lead, and no more discussion will be repeated here. Similar to FIG. 3, the array substrate shown in FIG. 4 includes: a base substrate 12, a gate electrode 13, a gate insulating layer 14, an active layer 15, a source electrode 16, a drain electrode 17, a pixel electrode 11 connected with the drain electrode 17, a data line 18 and a dummy lead 3 arranged in the same layer as the source electrode 16 and drain electrode 17, a first insulating layer 20, a touch dummy lead 24, a second insulating layer 23, and a touch electrode 5.

Based on the same invention concept, the embodiments of the disclosure provide a display panel, including the array substrate in accordance with the embodiments of the disclosure. The display panel in accordance with the embodiments of the disclosure may be, for example, a Touch and Display Driver Integration (TDDI) type display panel, a liquid crystal display panel, or an organic light emitting diode display panel. Since the principle of solving problems of the display panel is similar to that of the array substrate, the implementation of the display panel can be referred to that of the array substrate, and there will be no repetition.

Based on the same invention concept, the embodiments of the disclosure provide a display device, including a display panel in accordance with the embodiments of the disclosure.

The display device in accordance with the embodiment of the disclosure may be, for example, a device such as a mobile phone, a tablet computer, etc.

Since the principle of solving problems of the display device is similar to that of the display panel, the implementation of the display device can be referred to that of the display panel, and there will be no repetition.

Based on the same inventive concept, the embodiments of the disclosure also provide a method for manufacturing the array substrate. Since the principle of solving problems of the method is similar to that of the array substrate, the implementation of the manufacturing method can be referred to that of the array substrate, and there will be no repetition.

The method includes the step of forming a pattern of dummy leads and a pattern of data lines in the same layer on the base substrate; wherein the forming of the pattern of the dummy leads includes forming a pattern of a plurality of conducting wires which extend in the first direction and are disconnected with one another via a mask including a plurality of openings which extend in the first direction and are disconnected with one another.

Figure 5:
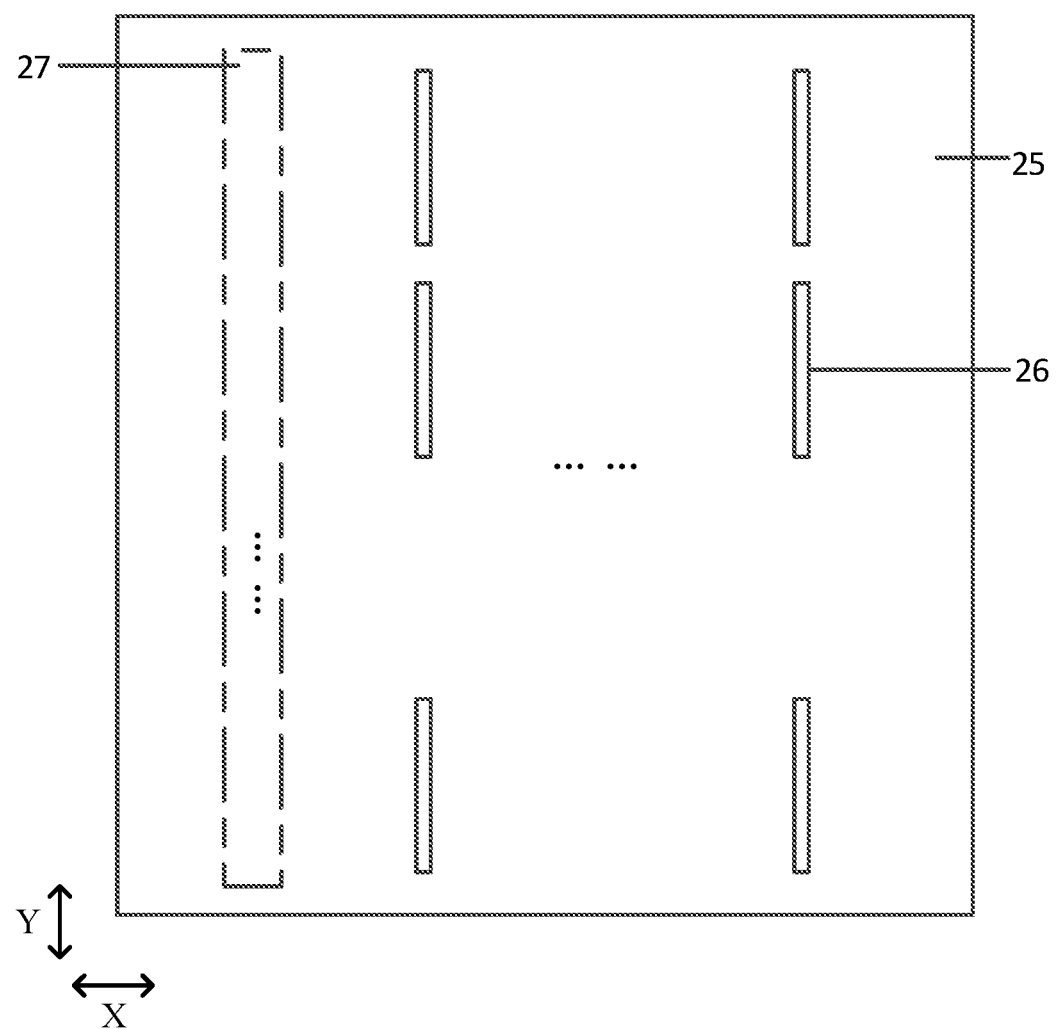
FIG. 5 is a schematic diagram showing a mask used to manufacture an array substrate in accordance with an embodiment of the disclosure.

Next, an example is given to illustrate the mask used in the method for manufacturing the array substrate in accordance with the embodiments of the disclosure. As shown in FIG. 5, the mask 25 includes a plurality of openings 26 which extend in the first direction Y and are disconnected with one another, and some openings are aligned in the first direction, such as a plurality of openings in the area 27 are aligned in the first direction Y. By evaporating metal materials with the mask, a plurality of aligned and disconnected conducting wires along the first direction can be formed in the corresponding part of the area 27 on the base substrate to form a dummy lead. Specifically, for example, a touch lead pattern and a data line pattern can be formed on the base substrate, and after that a dummy lead pattern can be formed by using the mask as shown in FIG. 5.

In summary, in the array substrate, method for manufacturing the same, display panel and display device in accordance with the embodiments of the disclosure, since the dummy lead includes a plurality of conducting wires which extend in the first direction and are disconnected with one another, when the dummy lead and the data line located in the same layer are short-circuited, the length of the conducting wire short-circuited with the data line is reduced, and the voltage reduction degree of the data line is decreased, so that the dark lines are avoided, the display effect and the user experience are improved. In specific implementation, the number of conducting wires in each dummy lead can be arranged to be equal to the number of touch electrodes in a touch electrode column, so as to facilitate the structure design of the array substrate and easily realize the process of forming a plurality of conducting wire segments. On this basis, the lengths of different conducting wires in each dummy lead are equal. Thus, the length of each conducting wire can be guaranteed to be the shortest, and the voltage reduction of the data line can be avoided to the greatest extent. Specifically, the sum of the number of dummy leads and the number of touch leads can be arranged to be equal to the number of pixel unit columns, thus the display uniformity of the products can be assured. In addition, when different conducting wires in each dummy lead are aligned in the first direction, the lead can be uniformly arranged in the area where the array substrate is located, and the display uniformity of the product can be further guaranteed.

Although preferred embodiments of the disclosure have been described, once those skilled in the art are aware of the basic creative concepts, additional changes and modifications may be made to these embodiments. Therefore, the appended claims are intended to be interpreted as including preferred embodiments and all changes and modifications falling within the scope of this disclosure.

Obviously, those skilled in the art may make various modifications and variations to the embodiments of the disclosure without departing from the spirit and scope thereof. Thus, if these modifications and variations of the embodiments of the disclosure fall within the scope of the claims and their equivalent technologies in the disclosure, the disclosure is also intended to include these modifications and variations.

The invention claimed is:

1. An array substrate, comprising:
   a base substrate;
   a plurality of data lines and a plurality of dummy leads; wherein the plurality of data lines and the plurality of dummy leads are in a same layer on the base substrate, and the plurality of data lines and the plurality of dummy leads extend in a first direction, and
   at least one of the dummy leads includes a plurality of conducting wires which extend in the first direction and are disconnected with one another;
   a plurality of touch electrodes on the base substrate and in a different layer with the data lines; wherein the plurality of the touch electrodes are in an array, the plurality of the touch electrodes include a plurality of touch electrode columns, a direction of the touch electrode columns is the first direction, and the number of the conducting wires in each of the dummy leads is equal to the number of the touch electrodes in one of touch electrode columns;
   a plurality of touch leads extending in the first direction and arranged in a second direction and a plurality of pixels in an array on the base substrate; wherein each of the touch electrodes is connected with at least one of the touch leads; the plurality of pixels comprise a plurality of pixel columns, a direction of the pixel columns is the first direction; a sum of the number of the dummy leads and the number of the touch leads is equal to the number of the pixel columns; at least one of the touch leads comprises a first sub-touch lead and a second sub-touch lead in different layers and connected through a via hole; and the second sub-touch lead and the data lines are in a same layer;
   touch dummy leads on the base substrate and in a same layer as the first sub-touch lead;
wherein an orthographic projection of at least one of the touch dummy leads on the base substrate has an overlapping area with an orthographic projection of at least one of the dummy leads on the base substrate and at least one of the touch dummy leads comprises a plurality of sub-leads which extend in the first direction and are disconnected with one another.

2. The array substrate according to claim 1, wherein an orthographic projection of each of the touch electrode columns on the base substrate has an overlapping area with an orthographic projection of at least one of the dummy leads on the base substrate.

3. The array substrate according to claim 2, wherein an orthographic projection of an interval area between two adjacent conducting wires in each of the dummy leads on the base substrate is within an orthographic projection of an interval area between two adjacent touch electrodes in each of the touch electrode columns on the base substrate.

4. The array substrate according to claim 1, wherein different conducting wires in each of the dummy leads are on a same straight line extending in the first direction.

5. The array substrate according to claim 1, wherein lengths of different conducting wires are equal.

6. A display panel, comprising the array substrate according to claim 1.

7. A display device, comprising the display panel according to claim 6.

* * * * *